United States Patent
Lynch et al.

(10) Patent No.: US 8,315,043 B2
(45) Date of Patent: Nov. 20, 2012

(54) METHODS AND SYSTEMS FOR FORMING HOUSINGS FROM MULTI-LAYER MATERIALS

(75) Inventors: Stephen Brian Lynch, Portola Valley, CA (US); John Benjamin Filson, San Jose, CA (US); Stephen Paul Zadesky, Portola Valley, CA (US); Douglas Weber, Arcadia, CA (US)

(73) Assignee: Apple Inc., Cupertino, CA (US)

( * ) Notice: Subject to any disclaimer, the term of this patent is extended or adjusted under 35 U.S.C. 154(b) by 245 days.

(21) Appl. No.: 12/234,437

(22) Filed: Sep. 19, 2008

(65) Prior Publication Data

US 2009/0190290 A1    Jul. 30, 2009

Related U.S. Application Data

(60) Provisional application No. 61/023,375, filed on Jan. 24, 2008.

(51) Int. Cl.
*G06F 1/16* (2006.01)
*H05K 5/00* (2006.01)
*H05K 7/00* (2006.01)
*B23P 19/00* (2006.01)

(52) U.S. Cl. .................................. 361/679.02; 29/739

(58) Field of Classification Search ............. 361/679.01, 361/679.02, 748, 752, 753, 760; 29/527.1, 29/739, 729; 455/575.1, 575.8
See application file for complete search history.

(56) References Cited

U.S. PATENT DOCUMENTS

| | | | | |
|---|---|---|---|---|
| 2,647,079 | A | * | 7/1953 | Burnham .................. 205/175 |
| 4,531,705 | A | * | 7/1985 | Nakagawa et al. .......... 249/134 |
| 4,993,148 | A | * | 2/1991 | Adachi et al. ................ 29/832 |
| 5,837,086 | A | * | 11/1998 | Leeb et al. ................. 156/245 |
| 5,872,699 | A | | 2/1999 | Nishii et al. |

(Continued)

FOREIGN PATENT DOCUMENTS

EP    0 114 565 A1    8/1984

(Continued)

OTHER PUBLICATIONS

U.S. Appl. No. 12/358,647, entitled "Method and Apparatus for Forming a Layer Metal Structure with an Anodized Surface", filed Jan. 23, 2009.

(Continued)

*Primary Examiner* — Adrian S Wilson
(74) *Attorney, Agent, or Firm* — Womble Carlyle Sandridge & Rice LLP

(57) ABSTRACT

Methods and apparatus for forming a housing, such as for an electronic device, from multi-layer materials are disclosed. The multi-layer materials include at least two layers. Typically, one or more of the layers are metal. However, different layers of the multi-layer materials can be different metals. In one embodiment, an inner layer of the multi-layer materials can be provided with or form internal features that can be for attaching parts or components to the multi-layer materials. In another embodiment, processing of an inner layer of the multi-layer materials can facilitate part formation with increased curvature and/or internal part clearance. In another embodiment, the multi-layer materials can include an intermediate layer that facilitates creation of internal features that can be for attaching parts or components to the multi-layer materials. In still another embodiment, the multi-layer materials can provide a protective layer that serves to protect an outer surface of the housing during manufacturing and/or assembly.

24 Claims, 8 Drawing Sheets

U.S. PATENT DOCUMENTS

| | | | |
|---|---|---|---|
| 5,925,847 A * | 7/1999 | Rademacher et al. | 174/372 |
| 6,331,239 B1 * | 12/2001 | Shirota et al. | 205/167 |
| 6,399,888 B1 * | 6/2002 | Chen | 174/138 G |
| 6,404,639 B1 | 6/2002 | Wakabayashi et al. | 361/719 |
| 6,574,096 B1 * | 6/2003 | Difonzo et al. | 361/679.27 |
| 6,768,654 B2 * | 7/2004 | Arnold et al. | 361/818 |
| 6,996,425 B2 * | 2/2006 | Watanabe | 455/575.1 |
| 7,134,198 B2 * | 11/2006 | Nakatani et al. | 29/841 |
| 7,181,172 B2 * | 2/2007 | Sullivan et al. | 455/90.3 |
| 7,225,529 B2 * | 6/2007 | Wang | 29/739 |
| 7,418,282 B2 * | 8/2008 | Nuovo et al. | 455/575.8 |
| 7,622,183 B2 * | 11/2009 | Shirai et al. | 428/209 |
| 7,691,189 B2 * | 4/2010 | En et al. | 106/1.23 |
| 7,729,131 B2 * | 6/2010 | Wang et al. | 361/818 |
| 7,733,667 B2 * | 6/2010 | Qin et al. | 361/804 |
| 8,007,704 B2 * | 8/2011 | Smith et al. | 264/272.11 |
| 8,031,485 B2 * | 10/2011 | Bogursky et al. | 361/816 |
| 2002/0097440 A1 | 7/2002 | Paricio et al. | |
| 2002/0109134 A1 * | 8/2002 | Iwasaki et al. | 257/13 |
| 2002/0130441 A1 * | 9/2002 | Robinson et al. | 264/442 |
| 2005/0023022 A1 * | 2/2005 | Kriege et al. | 174/52.4 |
| 2005/0034301 A1 * | 2/2005 | Wang | 29/739 |
| 2006/0055084 A1 | 3/2006 | Yamaguchi et al. | |
| 2006/0066771 A1 * | 3/2006 | Hayano et al. | 349/58 |
| 2007/0045893 A1 * | 3/2007 | Asthana et al. | 264/173.12 |
| 2007/0053504 A1 * | 3/2007 | Sato et al. | 379/156 |
| 2008/0195817 A1 * | 8/2008 | Hiew et al. | 711/115 |
| 2009/0017242 A1 | 1/2009 | Weber et al. | |
| 2009/0104949 A1 * | 4/2009 | Sato et al. | 455/575.3 |
| 2009/0236143 A1 * | 9/2009 | Nakamura | 174/520 |
| 2009/0260871 A1 * | 10/2009 | Weber | 174/535 |
| 2009/0305168 A1 | 12/2009 | Heley et al. | |
| 2010/0065313 A1 * | 3/2010 | Takeuchi et al. | 174/258 |

FOREIGN PATENT DOCUMENTS

WO   WO 2006/124279 A2   11/2006

OTHER PUBLICATIONS

Annerfors et al., "Nano Molding Technology on Cosmetic Aluminum Parts in Mobile Phones", Division of Production and Materials Engineering, LTH, 2007.

U.S. Appl. No. 11/964,652, entitled "Dual Layer Housing", filed Dec. 26, 2007.

* cited by examiner

METHODS AND SYSTEMS FOR FORMING HOUSINGS FROM MULTI-LAYER MATERIALS

CROSS-REFERENCE TO RELATED APPLICATIONS

This application claims priority of: (i) U.S. Provisional Patent Application No. 61/023,375, filed on Jan. 24, 2008, entitled "Methods and Systems for Forming Housings from Multi-layer Materials", which is incorporated herein by reference for all purposes; and (ii) U.S. Provisional Patent Application No. 60/949,780, filed on Jul. 13, 2007, entitled "Dual Layer Housing", which is incorporated herein by reference for all purposes.

BACKGROUND OF THE INVENTION

1. Field of the Invention

The present invention relates to forming housing for electronic devices.

2. Description of the Related Art

The manufacture of devices that include metal parts often includes the formation of features, e.g., complex mechanical structures, on surfaces of the metal parts. In order to ensure the structural integrity of such features, the features are often affixed to the surfaces of the metal parts using an adhesive material. By way of example, an internal feature has been obtained and glued in an appropriate location on a surface of a metal parts or housings.

Alternatively, internal features have been welded to the surface of metal parts or housings. Utilizing a welding process to attach internal features to metal parts is limiting in terms of the number and the complexity of the internal features that is possible using a welding technique. Furthermore, the cosmetic quality of a metal part may be degraded as a result of a welding process. For instance, the heat associated with a welding process may alter the shape and/or the color of a metal part.

Internal features may also be formed using an injection molding process. When a manufacturing process includes an injection molding process, a through-hole may be formed in a metal part or housing, and a plastic or a resin may be injected through the through-hole. The plastic or resin may form a feature on one side of the metal part, e.g., a metal sheet, while additional plastic or resin may form an undercut on the other side of the metal sheet. The undercut, in cooperation with the plastic or resin that hardens in the through-hole, may effectively serve to anchor or otherwise hold the feature in place. Often, the side of a metal sheet on which an undercut is located may be arranged to be exposed. That is, the side of a metal sheet on which an undercut is located may be an external surface of an apparatus or device. As such, the presence of an undercut on the side of the metal sheet may be aesthetically undesirable, e.g., when the metal sheet is arranged to serve a cosmetic purpose.

SUMMARY OF THE INVENTION

The invention pertains to forming a housing, such as for an electronic device, from multi-layer materials. The multi-layer materials include at least two layers. Typically, one or more of the layers are metal. However, different layers of the multi-layer materials can be different metals. In one embodiment, an inner layer of the multi-layer materials can be provided with or form internal features that can be for attaching parts or components to the multi-layer materials. In another embodiment, processing of an inner layer of the multi-layer materials can facilitate part formation with increased curvature and/or internal part clearance. In another embodiment, the multi-layer materials can include an intermediate layer that facilitates creation of internal features that can be for attaching parts or components to the multi-layer materials. In still another embodiment, the multi-layer materials can provide a protective layer that serves to protect an outer surface of the housing during manufacturing and/or assembly.

The invention may be implemented in numerous ways, including, but not limited to, as a method, system, device, or apparatus. Example embodiments of the present invention are discussed below.

As a portable electronic device, one embodiment of the invention includes at least an electronic component and a housing, where the housing includes at least a multi-layer material. The housing can be arranged to substantially house the electronic component.

As an assembly, one embodiment of the invention includes at least: a multi-layer metal sheet having at least a first metal layer and a second metal layer; and at least one attachment feature formed in or attached to the first metal layer.

As a housing for a portable electronic device, one embodiment of the invention includes at least: a multi-layer material having at least a first metal layer and a second metal layer; and at least one internal feature formed in, attached to, or formed from the first metal layer of the multi-layer material.

Various aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

Figure 1A:
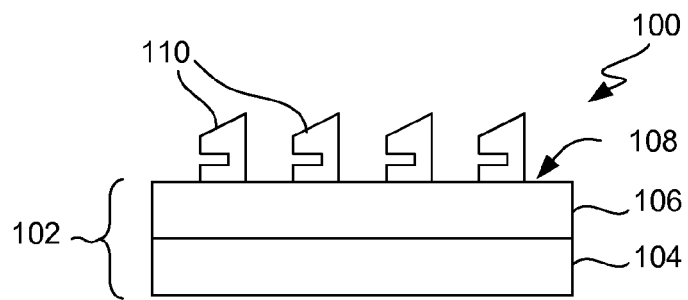
FIG. 1A is a cross-sectional side-view diagrammatic representation of a housing structure according to one embodiment of the invention.

Exemplary embodiments of the present invention are discussed below with reference to the various figures. However, those skilled in the art will readily appreciate that the detailed description given herein with respect to these figures is for explanatory purposes, as the invention extends beyond these embodiments.

The invention pertains to forming a housing, such as for an electronic device, from multi-layer materials. The multi-layer materials include at least two layers. Typically, one or more of the layers are metal. However, different layers of the multi-layer materials can be different metals. In one embodiment, an inner layer of the multi-layer materials can be provided with or form internal features that can be for attaching parts or components to the multi-layer materials. In another embodiment, processing of an inner layer of the multi-layer materials can facilitate part formation with increased curvature and/or internal part clearance. In another embodiment, the multi-layer materials can include an intermediate layer that facilitates creation of internal features that can be for attaching parts or components to the multi-layer materials. In still another embodiment, the multi-layer materials can provide a protective layer that serves to protect an outer surface of the housing during manufacturing and/or assembly.

In one embodiment, internal features or complex mechanical structures can be at a surface of a multi-layer material. One or more internal features or complex mechanical structures may be formed or attached to the multi-layer material. Examples of internal features of complex mechanical structures may include, but are not limited to including, structural members, frames, screw bosses, bridges, snaps, flexures, flanges, shelves, tapers, cavities, and/or pockets.

In one embodiment, a multi-layer material having at least one metal layer may be a portion or a component of a housing of an electronic device. A multi-layer material that is a portion of a housing of an electronic device may be a bezel section, a front section, and/or a back section of the housing. The multi-layer material may be a laminate combination in which at least one layer is metal and chosen from a wide variety of metals, including, but not limited to including, alloys, stainless steel, and aluminum.

In one embodiment, the housing being formed from multi-layer materials can be a metal part, housing, or sheet having multiple layers, where at least one of the layers is metal. The metal part, housing, or sheet may serve a structural and/or a cosmetic purpose. That is, a metal part, housing, or sheet having multiple layers may have a purely structural purpose, a purely aesthetic purpose, or both a structural purpose and an aesthetic purpose. For ease of discussion, a metal part, housing or sheet will generally be described as a housing, although it should be appreciated that a metal element may be substantially any suitable metal component associated with a device or an apparatus, such as a housing, a sheet, or an insert.

The invention can be utilized in a variety of different devices (e.g., electronic devices) including, but not limited to including, portable and highly compact electronic devices (i.e., portable electronic devices) with limited dimensions and space. In one embodiment, a device may be a laptop computer, a tablet computer, a media player, a mobile phone (e.g., cellular phone), a personal digital assistant (PDA), substantially any handheld electronic device, a computer mouse, a keyboard, a remote control, substantially any computer accessory, and/or substantially any computer peripheral. Typically, the electronic devices include at least one electrical component inside its housing. The electrical component can, for example, be an integrated circuit or circuit board. Examples of integrated circuits include memory, processor (microprocessor or controller), ASIC, and various others.

FIG. 1A is a cross-sectional side-view diagrammatic representation of a housing structure 100 according to one embodiment of the invention. The housing structure 100 includes a multi-layer material 102. The multi-layer material 102 can, for example, represent a material utilized as a housing, such as a housing of an electronic device. The multi-layer material 102 has an outer layer 104 and an inner layer 106. The outer layer 104 can serve as the outer surface of the housing and can be referred to as a cosmetic layer (or cosmetic surface). The inner layer 106 is normally not visible once the housing and/or electronic device is fabricated.

In one embodiment, the outer layer 104 and the inner layer 106 are metal layers that are laminated together, such as in a multi-layer sheet. However, the outer layer 104 and the inner layer 106 can utilize different metals. Since different metals can be used, the properties or characteristics of the different layers 104 and 106 can be advantageously utilized to form housings. For example, with regard to FIG. 1A, the outer layer 104 can be stainless steel, and the inner layer 106 can be aluminum. The housing structure 100 also includes features 110 that can be attached to a surface 108 of the inner layer 106. The features 110 can be utilized as binding features or attachment features to assist in the assembly of a housing that utilizes one or more other parts that are to be attached or bounded to the housing structure 100. As illustrated in FIG. 1A, the features 110 can be geometrically complex internal features that are suitable for operation as binding features or attachment features. In one embodiment, the features 110 are plastic or resin features that can be molded (e.g., insert-molded, injection-molded) onto the surface 108 of the inner layer 106. These plastic or resin features can bond themselves to the surface 108. With the inner layer 106 being aluminum, the plastic or resin features can form stronger bonds than would be available with other metals, such as stainless steel.

Figure 1B:
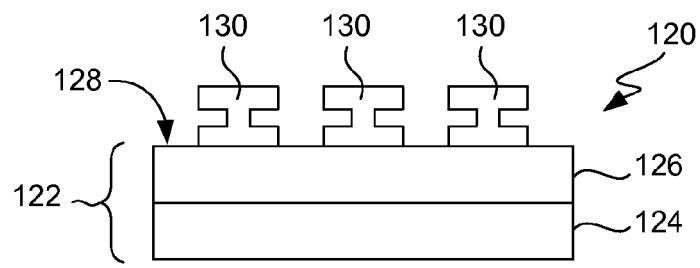
FIG. 1B is a cross-sectional side-view diagrammatic representation of a housing structure according to another embodiment of the invention.

FIG. 1B is a cross-sectional side-view diagrammatic representation of a housing structure 120 according to one embodiment of the invention. The housing structure 120 includes a multi-layer material 122. The multi-layer material 122 can, for example, represent a material utilized as a housing, such as a housing of an electronic device. The multi-layer material 122 has an outer layer 124 and an inner layer 126. The outer layer 124 can serve as the outer surface of the housing and can be referred to as a cosmetic layer (or cosmetic surface). In the inner layer 126 is normally not visible once the housing and/or electronic device is fabricated.

In one embodiment, the outer layer 124 and the inner layer 126 are metal layers that are laminated together, such as in a multi-layer sheet. For example, the layers can be laminated together using cladding. However, the outer layer 124 and the inner layer 126 can utilize different metals. Since different metals can be used, the properties or characteristics of the different layers 124 and 126 can be advantageously utilized to form housings. For example, with regard to FIG. 1B, the outer layer 124 can be stainless steel, and the inner layer 126 can be brass or copper. The housing structure 120 also includes features 130 that can be attached to a surface 128 of the inner layer 126. The features 130 can be utilized as binding features or attachment features to assist in the assembly of a housing that utilizes one or more other parts that are to be attached or bounded to the housing structure 120. As illustrated in FIG. 1B, the features 130 can be geometrically complex internal features that are suitable for operation as binding features or attachment features. In one embodiment, the features 130 are metal (e.g., brass, copper) features that can be manufactured and attached to the surface 128 of the inner layer 126 by way of soldering or brazing. With the inner layer 126 being brass or cooper, the brass or copper features can be easily soldered or brazed together, whereas soldering or brazing with some metals, such as stainless steel, is more difficult.

Figure 1C:
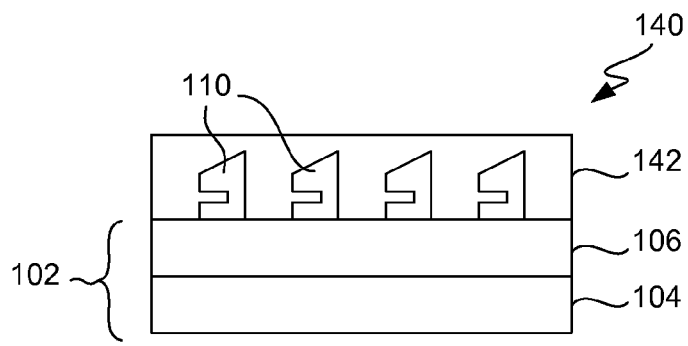
FIG. 1C is a cross-sectional side-view diagrammatic representation of a housing structure according to another embodiment of the invention.

FIG. 1C is a cross-sectional side-view diagrammatic representation of a housing structure 140 according to one embodiment of the invention. The housing structure 140 is similar to the housing structure 100 illustrated in FIG. 1A with the addition of an additional piece 142 bound to the multi-layer material 102. The additional piece 142 is adhered to the multi-layer material 122 through use of the features 110. The additional piece 142 can be attached to, or effectively molded around, the features 110. The additional piece 142 may, in one embodiment, be arranged to include complex mechanical features (not shown) which can be complementary to the features 110.

Figure 1D:
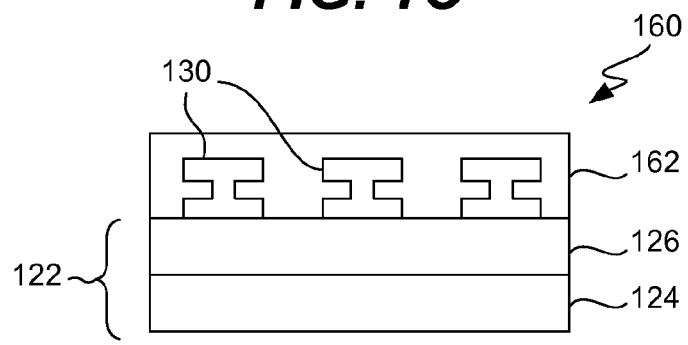
FIG. 1D is a cross-sectional side-view diagrammatic representation of a housing structure according to another embodiment of the invention.

FIG. 1D is a cross-sectional side-view diagrammatic representation of a housing structure 160 according to one embodiment of the invention. The housing structure 160 is similar to the housing structure 120 illustrated in FIG. 1B with the addition of an additional piece 162 bound to the multi-layer material 122. The additional piece 162 is adhered to the multi-layer material 122 through use of the features 130. The additional piece 162 can be attached to, or effectively molded around, the features 130. The additional piece 162 may, in one embodiment, be arranged to include complex mechanical features (not shown) which can be complementary to the features 130.

Figure 2A:
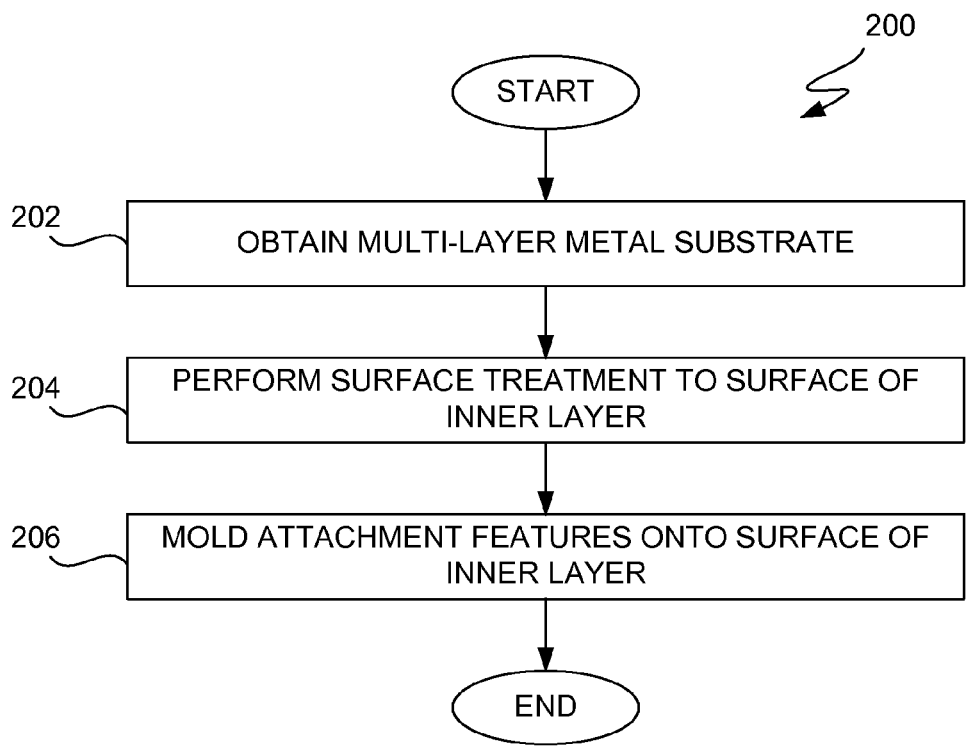
FIG. 2A is a process flow diagram which illustrates a method of forming a multi-layer structure in accordance with one embodiment of the invention.

FIG. 2A is a process flow diagram which illustrates a method 200 of forming a multi-layer structure in accordance with one embodiment of the invention. The multi-layer structure can be used as part of an overall assembly that is suitable for use in an electronic device. The multi-layer structure is a multiple layer metal part with a molded piece adhered thereto. For example, the multi-layer structure can, for example, be the housing structure 100 illustrated in FIG. 1A.

According to the method 200, a multi-layer metal substrate is obtained 202. For example, the multi-layer metal substrate is a substrate having two or more layers of metal. Typically, the multi-layer metal substrate includes layers of different metals. Next, a surface treatment is performed 204 on an inner surface of the inner layer of the multi-layer metal substrate. The surface treatment can, for example, be mechanical or chemical-based. For example, the inner surface of the inner layer of the multi-layer of metal substrate could be etched or chemically treated as a surface treatment. Thereafter, attachment features can be molded 206 onto the surface of the inner layer. The surface treatment operates allow the attachment features to securely bond to the inner surface of the inner layer. As a result, the inner layer of the multi-layer metal substrate can be chosen to provide strong bonding characteristics with respect to the attachment features, whereas the outer layer of the multi-layer metal substrate can be chosen for structural properties as well as outward appearance (e.g., cosmetic reasons).

Figure 2B:
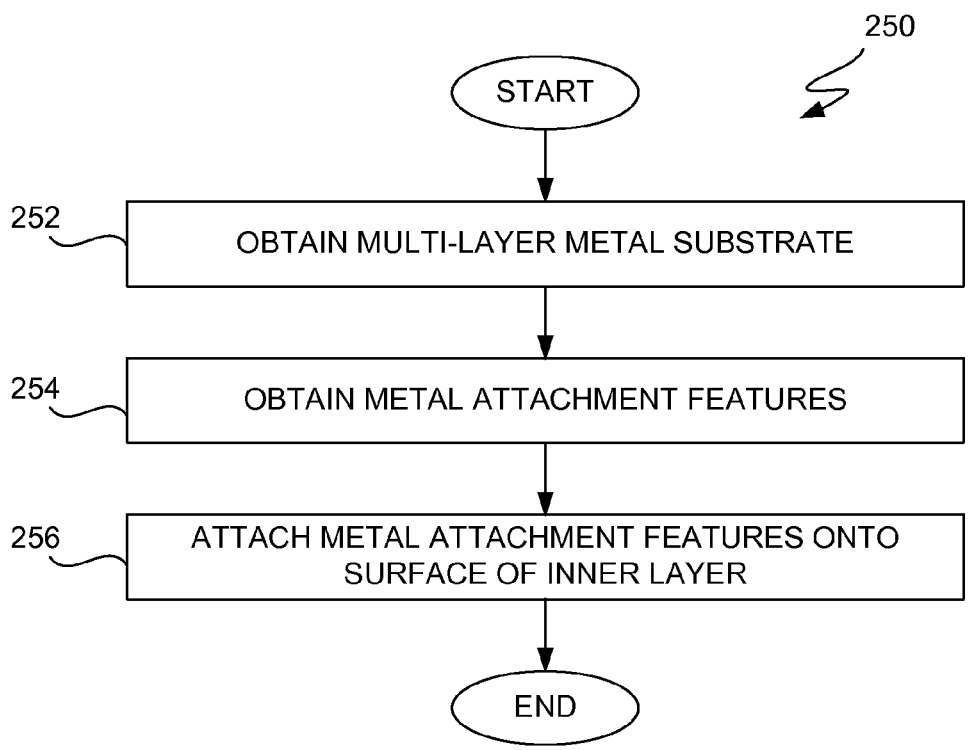
FIG. 2B is a process flow diagram which illustrates a method of forming a multi-layer structure in accordance with another embodiment of the invention.

FIG. 2B is a process flow diagram which illustrates a method 250 of forming a multi-layer structure in accordance with another embodiment of the invention. The multi-layer structure can be used as part of an overall assembly that is suitable for use in an electronic device. The multi-layer structure is a multiple layer metal part with a metal piece adhered thereto. For example, the multi-layer structure can, for example, be the housing structure 120 illustrated in FIG. 1B.

According to the method 250, a multi-layer metal substrate is obtained 202. For example, the multi-layer metal substrate is a substrate having two or more layers of metal. Typically, the multi-layer metal substrate includes layers of different metals. Next, metal attachment features can be obtained 254. For example, the metal attachment features can be geometrically complex shapes. Thereafter, the metal attachment features can be attached 256 onto the surface of the inner layer. For example, the metal attachment features can be attached through brazing or soldering. The metal attachment features operate to facilitate attachment of another part to the multi-layer metal substrate. As a result, the inner layer of the multi-layer metal substrate can be chosen to provide good brazing or soldering capabilities with respect to the metal attachment features, whereas the outer layer of the multi-layer metal substrate can be chosen for structural properties as well as outward appearance (e.g., cosmetic reasons). In one implementation, the metal attachment features are brass or cooper, the inner layer of the multi-layer metal substrate is brass or cooper, and the outer layer of the multi-layer metal substrate is stainless steel.

Figure 3A:
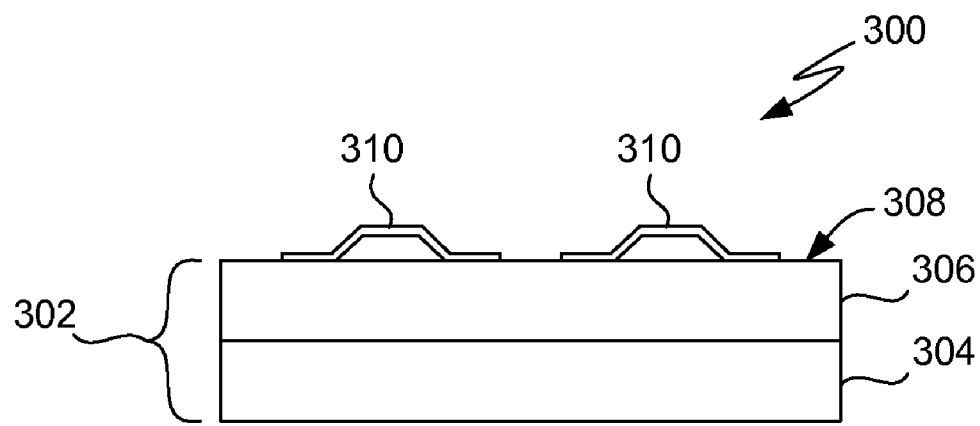
FIG. 3A is a cross-sectional side-view diagrammatic representation of a housing structure according to another embodiment of the invention.

FIG. 3A is a cross-sectional side-view diagrammatic representation of a housing structure 300 according to one embodiment of the invention. The housing structure 300 includes a multi-layer material 302. The multi-layer material 302 can, for example, represent a material utilized as a housing, such as a housing of an electronic device. The multi-layer material 302 has an outer layer 304 and an inner layer 306. The outer layer 304 can serve as the outer surface of the housing and can be referred to as a cosmetic layer (or cosmetic surface). The inner layer 306 is normally not visible once the housing and/or electronic device is fabricated.

In one embodiment, the outer layer 304 and the inner layer 306 are metal layers that are laminated together, such as in a multi-layer sheet. For example, the layers can be laminated together using cladding. However, the outer layer 304 and the inner layer 306 can utilize different metals. Since different metals can be used, the properties or characteristics of the different layers 304 and 306 can be advantageously utilized to form housings. For example, with regard to FIG. 3A, the outer layer 304 can be aluminum, and the inner layer 306 can be stainless steel. The housing structure 300 also includes features 310 that can be attached to a surface 308 of the inner layer 306. The features 310 can be utilized as binding features or attachment features to assist in the assembly of a housing that utilizes one or more other parts that are to be attached or bounded to the housing structure 300. As illustrated in FIG. 3A, the features 310 can be geometrically complex internal features that are suitable for operation as binding features or attachment features. In one embodiment, the features 310 are metal (e.g., stainless steel) features that can be manufactured and attached to the surface 308 of the inner layer 306 by way of welding (e.g., laser-spot welding). When the inner layer 306 and the features 310 are stainless steel, the stainless steel features can be easily welded to the surface 308 of the inner layer 306, whereas welding stainless steel to aluminum is not practical.

Figure 3B:
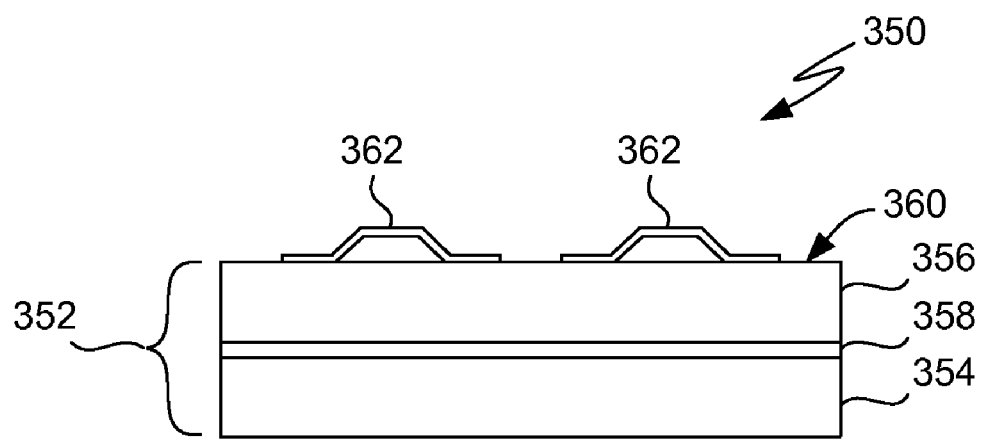
FIG. 3B is a cross-sectional side-view diagrammatic representation of a housing structure according to another embodiment of the invention.

FIG. 3B is a cross-sectional side-view diagrammatic representation of a housing structure 350 according to one embodiment of the invention. The housing structure 350 includes a multi-layer material 352. The multi-layer material 352 can, for example, represent a material utilized as a housing, such as a housing of an electronic device. The multi-layer material 352 has an outer layer 354, an inner layer 356, and an intermediate layer 358. The outer layer 354 can serve as the outer surface of the housing and can be referred to as a cosmetic layer (or cosmetic surface). The inner layer 356 is normally not visible once the housing and/or electronic device is fabricated. The intermediate layer 358 can operate as a protective layer, such as to protect the outer layer 354 from damage during processing or assembly of either the housing structure 350 or a housing of an electronic device making use of the housing structure 350.

In one embodiment, the outer layer 354 and the inner layer 356 are metal layers. In one implementation, the intermediate layer 358 is also metal. In another implementation, the intermediate layer 358 is not metal. In some embodiments, it is advantageous for the intermediate layer 358 to have high thermal conductivity, such as copper. In other embodiments, it is advantageous for the intermediate layer 358 to have low thermal conductivity, such as stainless steel (or a non-metal). In still other embodiment, it is advantageous for the intermediate layer 358 to have anisotropic thermal conductivity. The outer layer 354, the inner layer 356 and the intermediate layer 358 can be laminated together, such as in a multi-layer sheet. For example, the layers can be laminated together using cladding. The outer layer 354 and the inner layer 356 can utilize different metals. Since different metals are used, the properties or characteristics of the different layers 354 and 356 can be advantageously utilized to form housings. In one example, the outer layer 354 can be aluminum and the inner layer 356 can be stainless steel. In another example, the outer layer 354 can be stainless steel and the inner layer 356 can be aluminum. In still another example, the outer layer 354 and the inner layer 356 can be stainless steel.

The housing structure 350 illustrated in FIG. 3B can also include features 362 that can be attached to a surface 360 of the inner layer 356. The features 362 can be utilized as binding features or attachment features to assist in the assembly of a housing that utilizes one or more other parts that are to be attached or bounded to the housing structure 350. As illustrated in FIG. 3B, the features 362 can be geometrically complex internal features that are suitable for operation as binding features or attachment features. In one embodiment, the features 362 are metal (e.g., stainless steel) features that can be manufactured and attached to the surface 360 of the inner layer 356 by way of welding (e.g., laser-spot welding). With the inner layer 356 being stainless steel (or other compatible metal), the stainless steel features can be easily welded to the surface 360 of the inner layer 356. During the welding of the features 362 to the surface 360 of the inner layer 356, the outer layer 354 is protected by the intermediate layer 358. For example, the welding of the features 362 requires a significant amount of heating of the features 362 as well as the surface 360, and such generated heat can cause localized damage to portions of the outer layer 354. For example, when an intermediate layer is not used, localized damage from welding can cause undesired color or shape changes to the outer layer 354. Advantageously, however, when the intermediate layer 358 is provided between the outer layer 354 and the inner layer 356 of the multi-layer material 352, the intermediate layer 358 can serve to protect the generated heat during the welding from damaging to the outer layer 354.

Additionally, when an outer layer (e.g., outer layer 354) is a polished surface, such as polished stainless steel, assembly (when using a welding process to attach internal features) conventionally dictates that polishing of a stainless steel outer layer be performed after the welding process of the features. However, in accordance with one embodiment of the invention illustrated in FIG. 3B, the polishing of the stainless steel outer layer can be performed in advance of the welding process. Indeed, the polishing of the stainless steel outer layer can be performed while in the multi-layer material 352 is in a sheet form as opposed to later when the housing for an electronic device is partially assembled. Hence, it is more efficient to polish the stainless steel in a sheet form then it is to later polish assembled or partially assembled housings. The use of an intermediate layer (e.g., intermediate layer 358) to provide a thermal barrier protects the outer layer from thermal damage. In this embodiment, the thermal damage being presented is with regard to heat induced during a weld process; therefore, the intermediate layer can also be referred to as a weld barrier.

Figure 4:
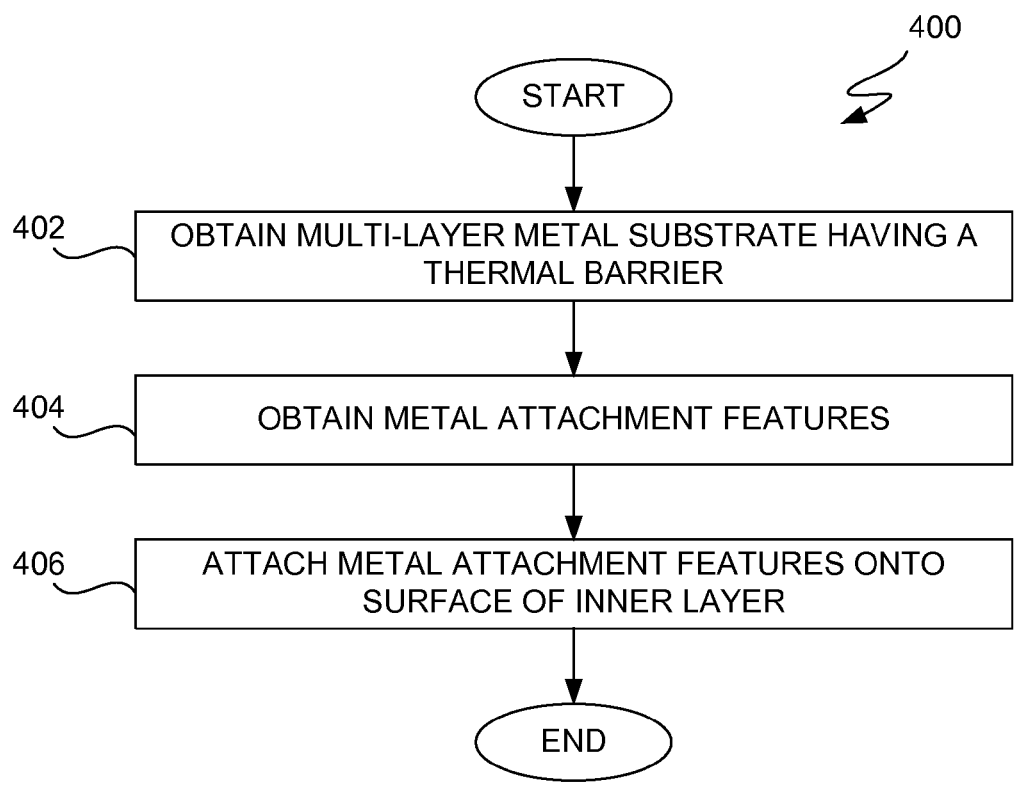
FIG. 4 is a process flow diagram which illustrates a method of forming a multi-layer structure in accordance with another embodiment of the invention.

FIG. 4 is a process flow diagram which illustrates a method 400 of forming a multi-layer structure in accordance with another embodiment of the invention. The multi-layer structure can be used as part of an overall assembly that is suitable for use in an electronic device. The multi-layer structure is a multiple layer metal part with a metal piece adhered thereto. For example, the multi-layer structure can, for example, be the housing structure 350 illustrated in FIG. 3B.

According to the method 400, a multi-layer metal substrate is obtained 402. For example, the multi-layer metal substrate is a substrate having two or more layers of metal as well as a thermal barrier layer. The thermal barrier layer can be, in one embodiment, a high thermal conductivity material. As an example, the thermal barrier layer can be a metal, such as copper that has high thermal conductivity. In an alternative embodiment, the thermal barrier can be a low thermal conductivity material. As an example, the thermal barrier layer can be a metal, such as stainless steel that has low thermal conductivity, or a non-metal, which tends to have even lower thermal conductivity. In still another embodiment, the thermal barrier layer is a material that has an anisotropic thermal conductivity, e.g., high thermal conductivity in the plane of the substrate (e.g., sheet) and low thermal conductivity orthogonal to the plane of the substrate (e.g., in the direction of attachment).

The two or more layers of metal for the multi-layer metal substrate can be the same metal or can be different metals. Next, metal attachment features can be obtained 404. For example, the metal attachment features can be geometrically complex shapes that are used to adhere other parts to the multi-layer metal substrate. Thereafter, the metal attachment features can be attached 406 onto the surface of the inner layer. The metal attachment features operate to facilitate attachment of another part to the multi-layer metal substrate. As a result, the inner layer of the multi-layer metal substrate can be chosen to provide welding (or brazing or soldering) capabilities with respect to the metal attachment features, whereas the outer layer of the multi-layer metal substrate can be chosen for structural properties as well as outward appearance (e.g., cosmetic reasons). In one implementation, the metal attachment features are aluminum or stainless steel, the inner layer of the multi-layer metal substrate is aluminum or stainless steel, and the intermediate layer is copper.

Figure 5:
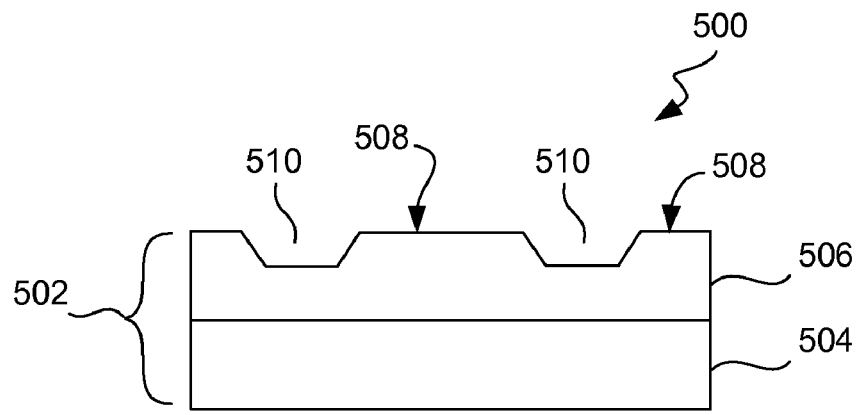
FIG. 5 is a cross-sectional side-view diagrammatic representation of a housing structure according to another embodiment of the invention.

FIG. 5 is a cross-sectional side-view diagrammatic representation of a housing structure 500 according to one embodiment of the invention. The housing structure 500 includes a multi-layer material 502. The multi-layer material 502 can, for example, represent a material utilized as a housing, such as a housing of an electronic device. The multi-layer material 502 has an outer layer 504 and an inner layer 506. The outer layer 504 can serve as the outer surface of the housing and can be referred to as a cosmetic layer (or cosmetic surface). In the inner layer 506 is normally not visible once the housing and/or electronic device is fabricated.

In one embodiment, the outer layer 504 and the inner layer 506 are metal layers that are laminated together, such as in a multi-layer sheet. For example, the layers can be laminated together using cladding. However, the outer layer 504 and the inner layer 506 can utilize different metals. Since different metals can be used, the properties or characteristics of the different layers 504 and 506 can be advantageously utilized to form housings. For example, with regard to FIG. 5, the outer layer 504 can be stainless steel, and the inner layer 506 can be aluminum. The housing structure 500 also has features 510 formed into a surface 508 of the inner layer 506. Such features 510 can be referred to as internal features. The features 510 can be utilized to assist in the assembly of a housing that utilizes one or more other parts that are to be attached or bounded to the housing structure 500. Alternatively, the features 510 can be utilized to provide recesses or regions of additional clearance as may be needed for counterpart parts for which the multi-layer material 500 abuts against or is adhered to during further assembly of a housing or other part. In one embodiment, the inner layer 506 utilizes a metal that can be machined without difficulty. For example, the inner layer 506 can be aluminum or brass, while the outer layer 504 can be stainless steel.

Figure 6:
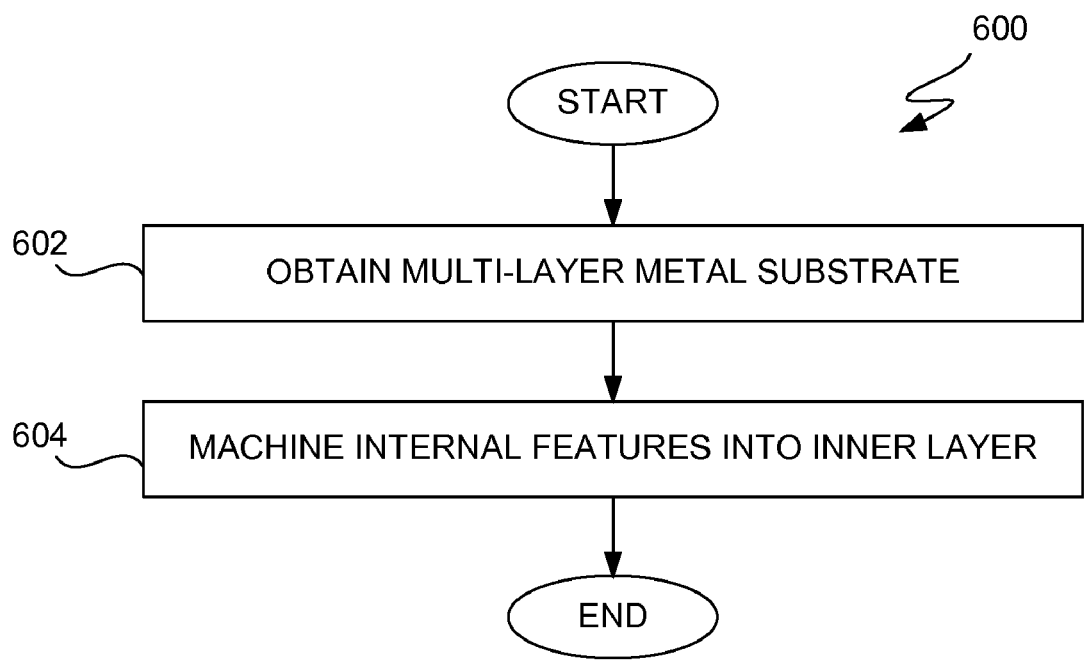
FIG. 6 is a process flow diagram which illustrates a method of forming a multi-layer structure in accordance with another embodiment of the invention.

FIG. 6 is a process flow diagram which illustrates a method 600 of forming a multi-layer structure in accordance with another embodiment of the invention. The multi-layer structure can be used as part of an overall assembly that is suitable for use in an electronic device. The multi-layer structure is a multiple layer metal part with machined regions to facilitate attachment and/or clearance. For example, the multi-layer structure can, for example, be the housing structure 500 illustrated in FIG. 5.

According to the method 600, a multi-layer metal substrate is obtained 602. For example, the multi-layer metal substrate is a substrate having two or more layers of metal. Typically, the multi-layer metal substrate includes layers of different metals. Next, internal features can be machined 604 into an inner layer of the multi-layer metal substrate. The internal features can facilitate attachment of another part to the multi-layer metal substrate. The internal features can also serve to provide additional clearance to components internal to a housing that is formed from the multi-layer metal substrate. As a result, the inner layer of the multi-layer metal substrate can be chosen to provide good machining characteristics, whereas the outer layer of the multi-layer metal substrate can be chosen for structural properties as well as outward appearance (e.g., cosmetic reasons). In one implementation, the inner layer of the multi-layer metal substrate is aluminum or brass, and the outer layer of the multi-layer metal substrate is stainless steel.

Besides attachment or clearance (as noted above with respect to FIGS. 5 and 6), it should be noted that internal features being machined into an inner layer of a multi-layer metal substrate can additionally or alternatively be used for alignment purposes when assembling a multi-part structure, such as a housing. In addition, machining of portions of an inner layer can also facilitate increased bending ability for the multi-layer material. For example, a curvature radius for corners that can be formed from a metal sheet is limited depending upon the thickness of the metal sheet. Hence, by machining away portions of the inner layer of the multi-layer material, the thickness of the multi-layer material can be reduced. As a result, a greater degree of curvature can be provided such that tight corners and/or sharp angles can be utilized when forming structures, such as housings for electronic devices.

Figure 7:
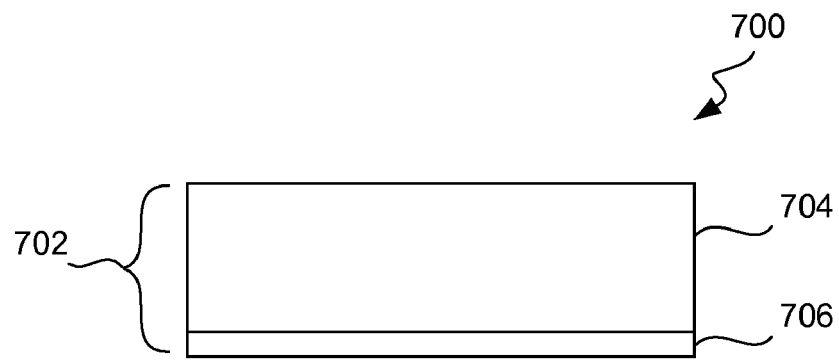
FIG. 7 is a cross-sectional side-view diagrammatic representation of a housing structure according to another embodiment of the invention.

FIG. 7 is a cross-sectional side-view diagrammatic representation of a housing structure 700 according to one embodiment of the invention. The housing structure 700 includes a multi-layer material 702. The multi-layer material 702 can, for example, represent a material utilized as a housing, such as a housing of an electronic device. In this embodiment, the multi-layer material 702 includes a primary layer 704 and an outer protective layer 706. The primary layer 704 can serve as the housing. In an alternative embodiment, the primary layer 704 can itself be a multi-layer material. The outer protective layer 706 serves to protect the primary layer 704 during fabrication and/or assembly of the housing. In one embodiment, the primary layer 704 and the outer protective layer 706 are metal layers that are laminated together, such as in a multi-layer sheet. The primary layer 704 and the outer protective layer 706 can, in such an embodiment, utilize different metals. Since different metals are used, the properties or characteristics of the different layers 704 and 706 can be utilized to form housings. For example, with regard to FIG. 7, the primary layer 704 can be stainless steel, such as pre-polished stainless steel, and the outer protective layer 706 can be any suitable material capable of protecting the primary layer 704 while also being removable following fabrication or assembly. As an example, the outer protective layer 706 can be a thin metal layer that can be subsequently removed by an etch process. Once the outer protective layer 706 has been removed, the primary layer 704 can be exposed and serve as a surface for the housing. In one implementation, it may be advantageous to provide a non-metal layer between the primary layer 704 and the outer protective layer 706. The non-metal layer may be able to better protect the primary layer 704 and may be able to be removed following fabrication and assembly with less damage or degradation to the resulting exposed surface of the primary layer 704.

Figure 8:
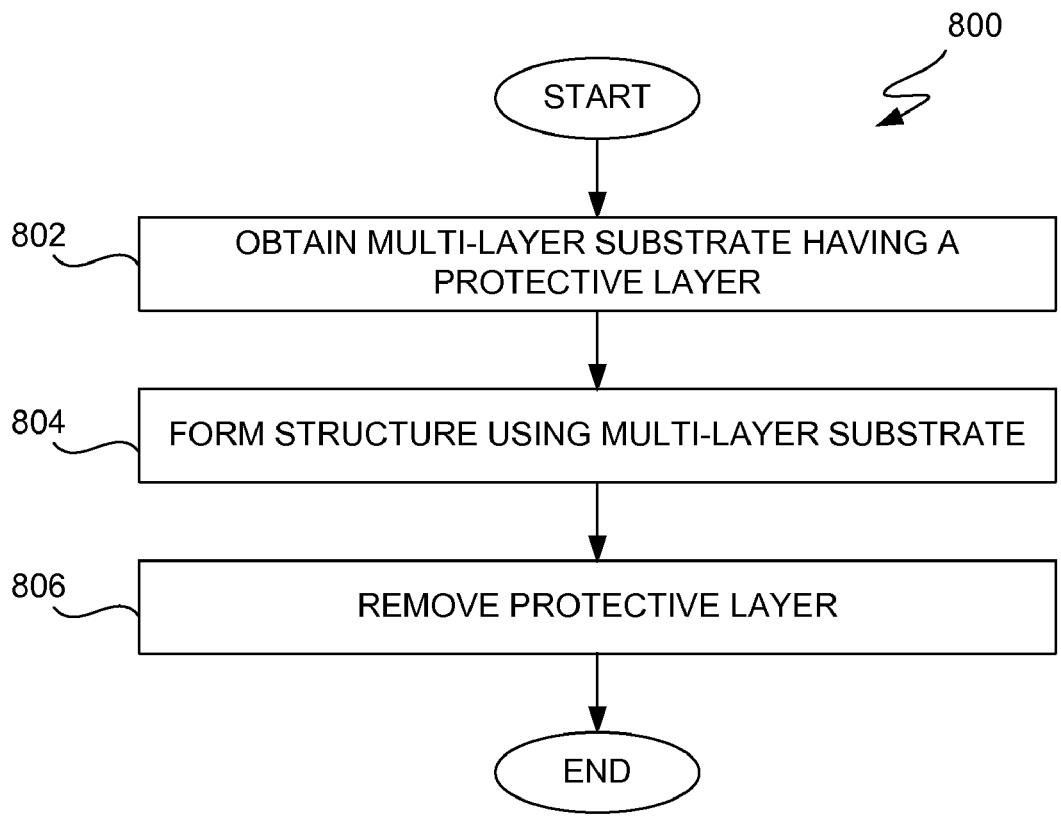
FIG. 8 is a process flow diagram which illustrates a method of forming a multi-layer structure in accordance with another embodiment of the invention.

FIG. 8 is a process flow diagram which illustrates a method 800 of forming a multi-layer structure in accordance with another embodiment of the invention. The multi-layer structure can be used as part of an overall assembly that is suitable for use in an electronic device. The multi-layer structure having one or more metal layers along with a protective layer. For example, the multi-layer structure can, for example, be the housing structure 700 illustrated in FIG. 7.

According to the method 800, a multi-layer substrate having a protective layer is obtained 802. For example, the multi-layer substrate is a substrate having one or more layers of metal as well as a protective layer. As an example, the protective layer can be a metal. Once the multi-layer substrate has been obtained 802, one or more structures can be formed 804 using the multi-layer substrate. As an example, one structure that can be formed using the multi-layer substrate is a housing for an electronic device. Subsequently, the protective layer can be removed 806, thereby exposing the underlying metal layer of the multi-layer substrate.

Figure 9A:
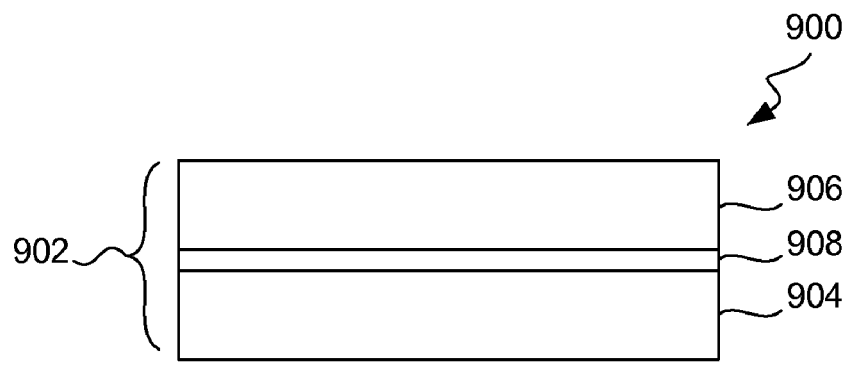
FIG. 9A is a cross-sectional side-view diagrammatic representation of a housing structure according to another embodiment of the invention.

FIG. 9A is a cross-sectional side-view diagrammatic representation of a housing structure 900 according to one embodiment of the invention. The housing structure 900 includes a multi-layer material 902. The multi-layer material 902 can, for example, represent a material utilized as a housing, such as a housing of an electronic device. The multi-layer material 902 has an outer layer 904, an inner layer 906, and an intermediate layer 908. The outer layer 904 can serve as the outer surface of the housing and can be referred to as a cosmetic layer (or cosmetic surface). The inner layer 906 is normally not visible once the housing and/or electronic device is fabricated. The intermediate layer 908 can operate to facilitate formation of internal features using portions of the inner layer 906. The intermediate layer 908 can also be referred to as a filler layer.

In one embodiment, the outer layer 904 and the inner layer 906 are metal layers. In one implementation, the intermediate layer 908 is also metal. In another implementation, the intermediate layer 908 is not metal. The outer layer 904, the inner layer 906 and the intermediate layer 908 can be laminated together, such as in a multi-layer sheet. The outer layer 904 and the inner layer 906 can utilize different metals. If different metals are used, the properties or characteristics of the different layers 904 and 906 can be advantageously utilized to form housings. In one example, the outer layer 904, the inner layer 906 and the intermediate layer 908 can be stainless steel.

Figure 9B:
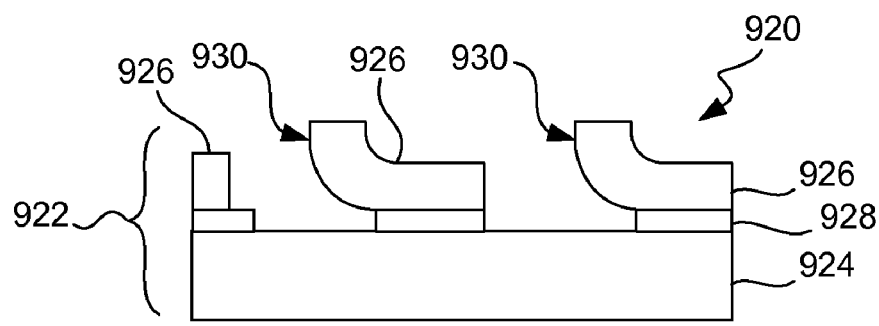
FIG. 9B is a cross-sectional side-view diagrammatic representation of a housing structure according to another embodiment of the invention.

FIG. 9B is a cross-sectional side-view diagrammatic representation of a housing structure 920 according to one embodiment of the invention. The housing structure 920 includes a multi-layer material 922. The multi-layer material 922 can, for example, represent a material utilized as a housing, such as a housing of an electronic device. The multi-layer material 922 shown in FIG. 9B represents one embodiment of the multi-layer material 902 after internal features have been formed. The multi-layer material 922 has an outer layer 924, an inner layer 926, and an intermediate layer 928. The outer layer 924 can serve as the outer surface of the housing and can be referred to as a cosmetic layer (or cosmetic surface). The inner layer 926 is normally not visible once the housing and/or electronic device is fabricated. The intermediate layer 928 can operate to facilitate formation of internal features using portions of the inner layer 926. The intermediate layer 928 can also be referred to as a filler layer.

To facilitate formation of the features using the inner layer 926, the intermediate layer 928 can have a pre-formed pattern. In one embodiment, the pre-formed pattern can be provided to the intermediate layer 928 prior to formation of the multi-layer material 922. For example, the pre-formed pattern can include a number of void regions where the intermediate layer 928 has a void or opening. Alternatively, instead of having a pre-formed pattern, the intermediate layer 928 can be processed to separate the inner layer 926 from the intermediate layer 928 (and correspondingly also separate from the outer layer 924) at selected regions. For example, such processing to separate the inner layer 926 from the intermediate layer 928 could, for example, drill or etch away localized regions of the intermediate layer 928. In any case, through use of the pre-formed pattern or processing, selected portions of the inner layer 926 can be formed into internal features. As illustrated in FIG. 9B, selected portions of the inner layer 926 can be physically manipulated, such as through bending, to form internal features 930. The internal features 930 can be utilized as binding features or attachment features to assist in the assembly of a housing that utilizes one or more other parts that are to be attached or bounded to the housing structure 920. As illustrated in FIG. 9B, the internal features 930 can be geometrically complex internal features that are suitable for operation as binding features or attachment features.

Figure 9C:
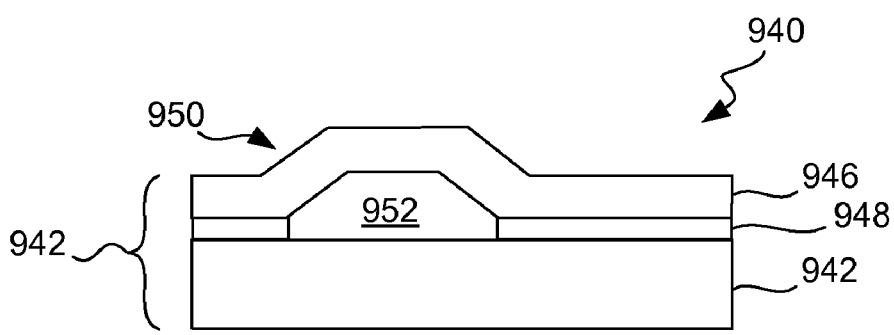
FIG. 9C is a cross-sectional side-view diagrammatic representation of a housing structure according to another embodiment of the invention.

FIG. 9C is a cross-sectional side-view diagrammatic representation of a housing structure 940 according to one embodiment of the invention. The housing structure 940 includes a multi-layer material 942. The multi-layer material 942 can, for example, represent a material utilized as a housing, such as a housing of an electronic device. The multi-layer material 942 shown in FIG. 9C represents one embodiment of the multi-layer material 942 after internal features have been formed. The multi-layer material 942 has an outer layer 944, an inner layer 946, and an intermediate layer 948. The outer layer 944 can serve as the outer surface of the housing and can be referred to as a cosmetic layer (or cosmetic surface). The inner layer 946 is normally not visible once the housing and/or electronic device is fabricated. The intermediate layer 948 can operate to facilitate formation of internal features using portions of the inner layer 946. The intermediate layer 948 can also be referred to as a filler layer.

To facilitate formation of the features using the inner layer 946, the intermediate layer 948 can have a pre-formed pattern. In one embodiment, the pre-formed pattern can be provided to the intermediate layer 948 prior to formation of the multi-layer material 942. For example, the pre-formed pattern can include a number of void regions where the intermediate layer 948 has a void or opening. Alternatively, instead of having a pre-formed pattern, the intermediate layer 948 can be processed to separate the inner layer 946 from the intermediate layer 948 (and correspondingly also separate from the outer layer 944) at selected regions. For example, such processing to separate the inner layer 946 from the intermediate layer 948 could, for example, drill or etch away localized regions of the intermediate layer 948. In any case, through use of the pre-formed pattern or processing, selected portions of the inner layer 946 can be formed into internal features. As illustrated in FIG. 9C, selected portions of the inner layer 946 can be physically manipulated, such as through hydro-formation, to form internal features 950. For example, hydro-formation at the selected portion of the inner layer 946 can be physically altered to form internal ribs or other shapes. The internal features 950 can be utilized as binding features or attachment features to assist in the assembly of a housing that utilizes one or more other parts that are to be attached or bounded to the housing structure 940. As illustrated in FIG. 9C, the internal features 950 can be geometrically complex internal features that are suitable for operation as binding features or attachment features.

Figure 10:
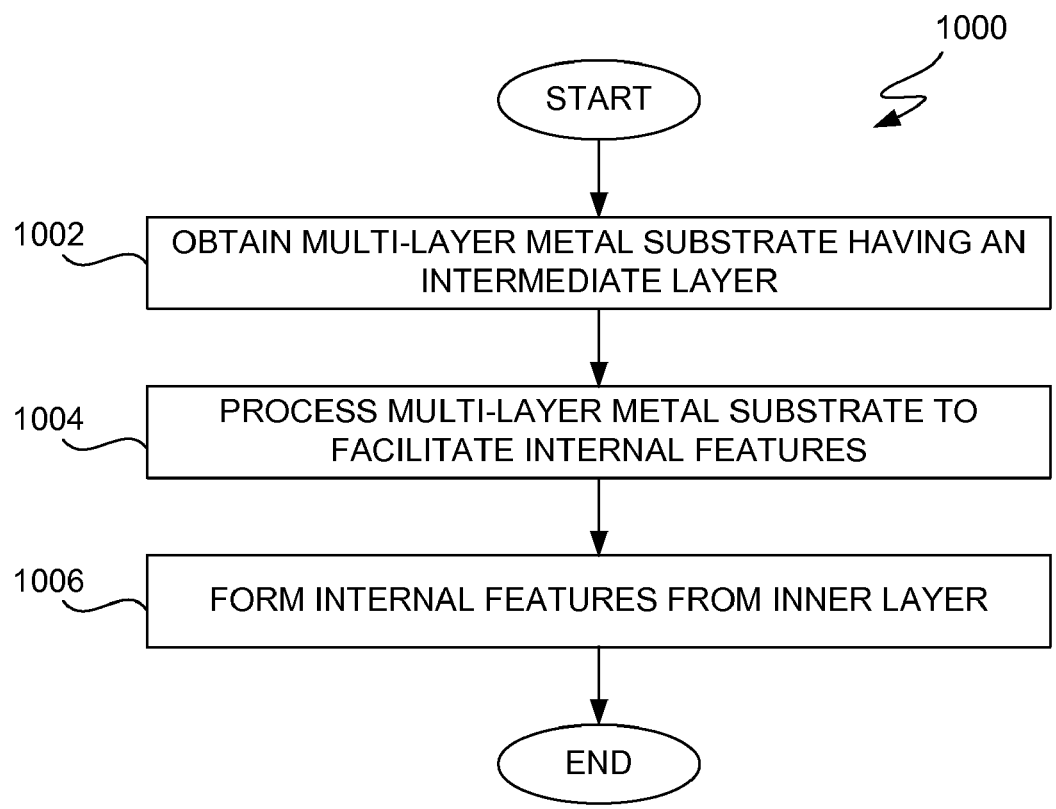
FIG. 10 is a process flow diagram which illustrates a method of forming a multi-layer structure in accordance with another embodiment of the invention.

FIG. 10 is a process flow diagram which illustrates a method 1000 of forming a multi-layer structure in accordance with another embodiment of the invention. The multi-layer structure can be used as part of an overall assembly that is suitable for use in an electronic device. The multi-layer structure is a multiple layer metal part with an intermediate layer provided between inner and outer metal layers. For example, the multi-layer structure can, for example, be the housing structure 900 illustrated in FIG. 9A.

According to the method 1000, a multi-layer metal substrate is obtained 1002. For example, the multi-layer metal substrate is a substrate having two or more layers of metal (e.g., an inner layer and an outer layer) as well as an intermediate layer. Next, the multi-layer metal substrate can be processed 1004 to facilitate internal features. In this regard, depending upon the intermediate layer, processing 1004 can be utilized to separate regions of the inner layer of the multi-layer metal substrate from the intermediate layer as well as the outer layer of the multi-layer metal substrate. For example, if the intermediate layer is pre-punched, the processing 1004 may not be required since upon formation of the multi-layer metal substrate, regions where the inner layer is already separated from the intermediate layer (and outer layer). However, in the case in which the intermediate layer is not pre-punched, the processing 1004 can drill or etch way localized regions of the intermediate layer so as to separate the inner layer from the outer layer at such regions. Following the processing 1004, if any, internal features can be formed 1006 from the inner layer. Here, the internal features are formed 1006 from the inner layer at the regions where the inner layer is or has been separated from the outer layer (and intermediate layer). As an example, following the formation of 1006 of the internal features, the multi-layer metal substrate can correspond to the housing structure 920 illustrated in FIG. 9B or the housing structure 940 illustrated in FIG. 9C.

Additional information on housings having multiple layers can be found in: (i) U.S. patent application Ser. No. 11/964,652, filed on Dec. 26, 2007, entitled "Methods and Systems for Forming a Dual Layer Housing", which is incorporated herein by reference for all purposes; and (ii) U.S. Provisional Patent Application No. 60/949,780, filed on Jul. 13, 2007, entitled "Dual Layer Housing", which is incorporated herein by reference for all purposes.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A portable electronic device, comprising:
    an electronic component;
    a housing, the housing being arranged to substantially house the electronic component, wherein the housing includes at least a multi-layer material having at least an inner layer; and
    at least one internal feature formed or attached to the inner layer of the multi-layer material, the at least one internal feature being configured to attach an internal part to the inner layer,
    wherein the internal part comprises a molded piece, the molded piece being attached to the multi-layer material via the at least one internal feature such that the molded piece is molded around the at least one internal feature.

2. A portable electronic device of claim 1, wherein the inner layer is a metal layer.

3. A portable electronic device of claim 2, wherein the multi-layer material further includes a protective layer.

4. A portable electronic device of claim 1, wherein the multi-layer material includes at least two metal layers.

5. A portable electronic device of claim 4, wherein the multi-layer material includes an intermediate layer interposed between the two metal layers.

6. A portable electronic device of claim 1, wherein the multi-layer material has at least an inner metal layer and an outer metal layer.

7. A portable electronic device of claim 6, wherein the multi-layer material includes an intermediate layer interposed between the inner metal layer and the outer metal layer.

8. A portable electronic device of claim 6, wherein the at least one internal feature is welded to the inner metal layer, and wherein an intermediate layer serves as a thermal barrier.

9. A portable electronic device of claim 6, wherein the inner metal layer of the multi-layer material has at least one internal feature formed therein.

10. A portable electronic device of claim 7, wherein the at least one internal feature is formed from the inner metal layer.

11. A portable electronic device of claim 10, wherein the intermediate layer is pre-patterned.

12. A portable electronic device of claim 11, wherein the intermediate layer is metal.

13. An assembly comprising:
    a multi-layer metal sheet having at least a first metal layer and a second metal layer; and
    at least one attachment feature formed in or attached to the first metal layer, the at least one attachment feature assists with adhering at least one component to the multi-layer sheet,
    wherein the at least one component comprises a molded piece, the molded piece being adhered to the multi-layer metal sheet via the at least one attachment feature such that the molded piece is molded around the at least one internal feature.

14. An assembly of claim 13, wherein the multi-layer sheet includes an intermediate layer interposed between the first metal layer and the second metal layer.

15. An assembly of claim 14, wherein the at least one attachment feature is welded to the first metal layer, and wherein the intermediate layer serves as a thermal barrier.

16. An assembly of claim 14, wherein the intermediate layer is pre-patterned.

17. An assembly of claim 14, wherein the intermediate layer is metal.

18. An assembly of claim 13, wherein the first metal layer of the multi-layer sheet has at least one internal feature formed therein.

19. An assembly of claim 13, wherein the at least one attachment feature is formed from the first metal layer.

20. A housing for a portable electronic device, comprising:
    a multi-layer material having at least a first metal layer and a second metal layer;
    at least one internal feature formed in, attached to, or formed from the first metal layer of the multi-layer material, the at least one internal feature assists with adhering at least one component to the second metal layer,
    an intermediate layer interposed between the first metal layer and the second metal layer, wherein the intermediate layer is designed to protect the second metal layer,
    wherein the at least one component is a molded piece, the molded piece being attached to the multi-layer material via the at least one internal feature such that the molded piece is molded around the at least one internal feature.

21. A housing of claim 20, wherein the multi-layer material further includes an outer protective layer.

22. A housing of claim 20, wherein the intermediate layer serves as a thermal barrier.

23. A portable electronic device of claim 8, wherein the thermal barrier is designed to protect the outer metal layer.

24. A housing of claim 15, wherein the thermal barrier is designed to protect the second metal layer.

* * * * *

UNITED STATES PATENT AND TRADEMARK OFFICE
CERTIFICATE OF CORRECTION

PATENT NO. : 8,315,043 B2
APPLICATION NO. : 12/234437
DATED : November 20, 2012
INVENTOR(S) : Stephen Brian Lynch et al.

It is certified that error appears in the above-identified patent and that said Letters Patent is hereby corrected as shown below:

In the Claims:

Column 14, line 24 (Claim 13): "internal feature." should read -- attachment feature. --.

Column 14, line 60 (Claim 24): "A housing" should read -- An assembly --.

Signed and Sealed this
Sixteenth Day of June, 2015

Michelle K. Lee
*Director of the United States Patent and Trademark Office*